United States Patent [19]

Yoshizaki

[11] Patent Number: 4,468,616
[45] Date of Patent: Aug. 28, 1984

[54] TESTING EQUIPMENT FOR ELECTRIC COMPONENTS
[75] Inventor: Tsutomu Yoshizaki, Yokosuka, Japan
[73] Assignee: Fujitsu Limited, Kawasaki, Japan
[21] Appl. No.: 296,312
[22] Filed: Aug. 26, 1981
[51] Int. Cl.³ ............................................. G01R 31/00
[52] U.S. Cl. .................................... 324/158 F; 324/51; 324/73 PC
[58] Field of Search ................. 324/51, 73 PC, 158 F
[56] References Cited
U.S. PATENT DOCUMENTS

| | | | |
|---|---|---|---|
| 3,609,547 | 9/1971 | Slusser | 324/158 F |
| 3,715,662 | 2/1973 | Richelmann | 324/158 F |
| 3,824,462 | 7/1974 | Vinsani | 324/158 F |
| 4,145,620 | 3/1979 | Dice | 324/73 PC |

Primary Examiner—Stewart J. Levy
Attorney, Agent, or Firm—Staas & Halsey

[57] ABSTRACT

Testing equipment for electric components comprises: a high-temperature section including a homoiothermic chamber in which a plurality of components to be tested are heated, and a first printed board on which the components to be tested are mounted; a low-temperature section including a driving circuit for the components to be tested, a second printed board on which the driving ciruit is mounted, and electric power sources; and a connecting unit for electrical connection between the high-temperature and low-temperature sections. The connecting unit comprises: a third printed board disposed outside the homoiothermic chamber, a first surface of the third printed board facing the wall of the homoiothermic chamber with a space therebetween; a first connector jack mounted on the first surface of the third printed board through electrical conductor pins; and a second connector jack mounted on the second surface of the third printed board. The first and second printed boards are connected to the first and second connector jacks, respectively, and the electric power sources are connected to the third printed board.

3 Claims, 3 Drawing Figures

TESTING EQUIPMENT FOR ELECTRIC COMPONENTS

BACKGROUND OF THE INVENTION

The present invention relates to testing equipment for electric components and, more specifically, to a kind of testing equipment generally referred to as ageing equipment, "burn-in equipment" or "debugging equipment", in which the components to be tested are operated under the condition of being maintained at a constant high temperature.

There is known testing equipment of the kind mentioned above, which comprises: a high-temperature section including a homoiothermic chamber in which a plurality of components to be tested are contained and heated to a constant high temperature; a low-temperature section including a driving circuit generating signals for the operation of the components to be tested, and electric power sources for the driving circuit and the components to be tested; and connecting means for an electrical connection between the high-temperature and low-temperature sections.

In this known equipment, however, there is a problem in the electric connection between the high-temperature and low-temperature sections. Conventionally, these equipment sections are interconnected by using a cable or a printed board. In the construction wherein the cable is used, the cable is rather long and exerts a harmful influence upon the electrical characteristics of the equipment. Moreover, the connection and disconnection of the cable to and from the equipment sections requires a long working time. Accordingly, when either of the equipment sections has broken down, the repair thereof often requires a half or one whole day. In the case of using the printed board, on the other hand, the printed board performs both of the functions of feeding high-frequency signals and feeding the electric power. This fact makes maintenance of the equipment difficult. Moreover, the connection and disconnection of the printed board to and from the equipment sections also requires a long working time. Furthermore, the cable or the printed board is disposed in a space between the equipment sections and disturbs the ventilation for heat insulation between the equipment sections.

SUMMARY OF THE INVENTION

It is an object of the present invention to provide improved testing equipment for electric components of the aforementioned kind, in which the connection between the high-temperature and low-temperature sections is improved to eliminate the above-mentioned drawbacks of conventional equipment.

More specifically, the present invention provides testing equipment for electric components of the aforementioned kind, in which the high-temperature section comprises a first printed board contained in a homoiothermic chamber, on which the components to be tested are mounted, the low-temperature section comprises a second printed board on which the driving circuit is mounted, and the connecting means comprises a connecting unit including: a third printed board disposed outside the homoiothermic chamber, one of the surfaces of the third printed board facing the wall of the homoiothermic chamber with a space therebetween; a first connector jack mounted on the one surface of the third printed board through electrical conductor pins and attached to the wall of the homoiothermic chamber; and a second connector jack mounted on the other surface of the third printed board. The first and second printed boards are removably connected to the first and second connector jacks, respectively, and the electric power sources are connected to the third printed board.

Preferably, the third printed board of the connecting unit forms a wall of the low-temperature section, and the space between the third printed board and the homoiothermic chamber provides a ventilation passage for heat insulation between the high-temperature and low-temperature sections.

BRIEF DESCRIPTION OF THE DRAWINGS

The present invention will now be described in detail based on a preferred embodiment with reference to the accompanying drawings; in which.

DESCRIPTION OF THE PREFERRED EMBODIMENT

Referring to the figures, the illustrated testing equipment generally comprises a high-temperature section H, a low-temperature or normal-temperature section L, and a connecting unit C for electrical connection between the sections H and L. The high-temperature section H comprises a homoiothermic chamber 10, in which a plurality of electric components 11 such as IC or LSI, which are to be tested, are contained and heated to a constant high temperature of about 150° to 200° C. The components 11 are mounted on first printed boards 12 contained in the homoiothermic chamber 10.

Figure 1:
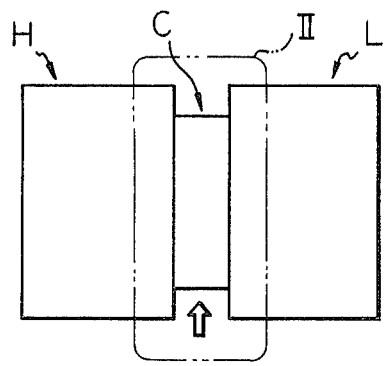
FIG. 1 is a diagrammatic plan view of testing equipment for electric components according to the present invention.
Figure 2:
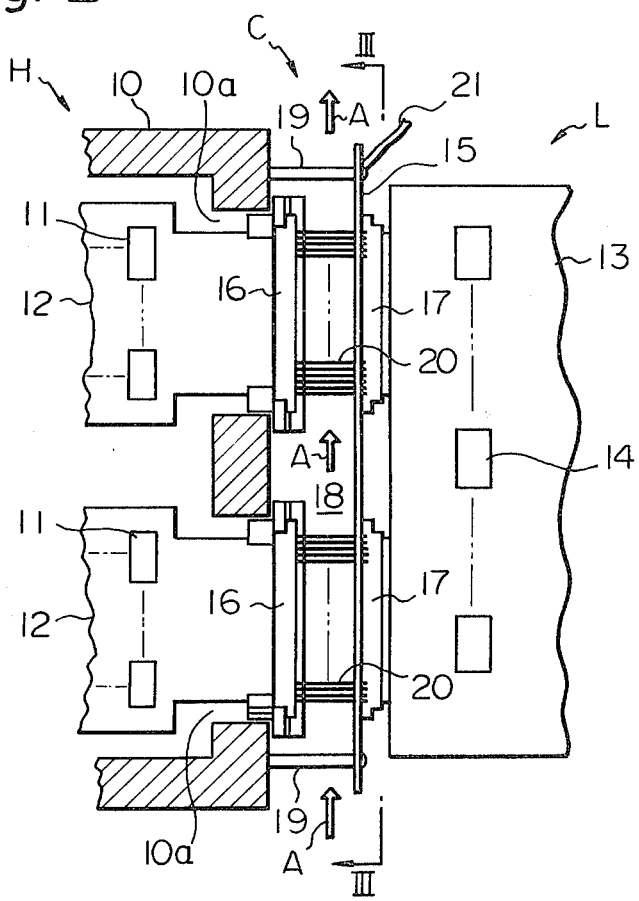
FIG. 2 is an enlarged and partially sectional plan view of the portion designated by a reference "II" in FIG. 1.
Figure 3:
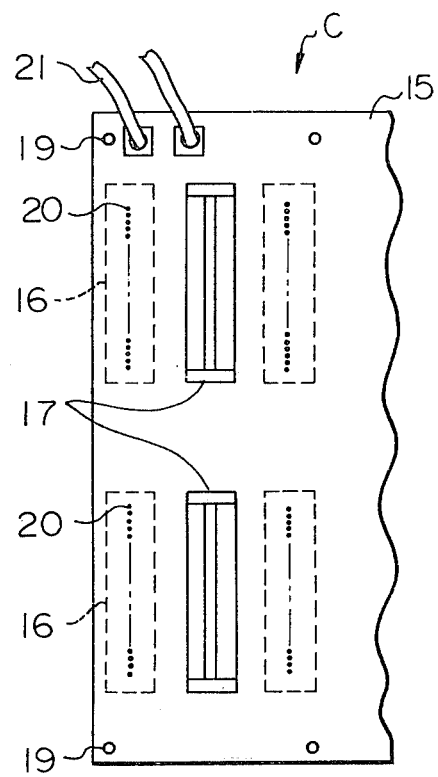
FIG. 3 is a partial side view of a connecting unit, seen along a line "III—III" in FIG. 2.

The low-temperature section L comprises a second printed board 13, on which is mounted a driving circuit which generates signals for the operation of the components 11 to be tested. For simplifying the drawings, only components 14 of this driving circuit only are illustrated in FIG. 2. Although not illustrated, the low-temperature section L also includes electric power sources for the driving circuit and the components 11 to be tested.

The connecting unit C generally comprises a third printed board 15, first connector jacks 16 and second connector jacks 17. The third printed board 15 is disposed outside the homoiothermic chamber 10, so that one of the surfaces of the printed board 15 faces the wall of the homoiothermic chamber 10 with a space 18 therebetween. The printed board 15 is removably secured to the wall of the homoiothermic chamber 10 by suitable fasteners 19, such as screws. The first connector jacks 16 are mounted on the surface of the third printed board 15, facing the wall of the homoiothermic chamber 10, through electrical conductor pins 20. The distance between the printed board 15 and the connector jacks 16 is for example, 20 to 30 mm. The connector jacks 16 are also attached to the wall of the homoiothermic chamber 10. The wall of the chamber 10 is provided with openings 10a, through which the edge portions of the first printed boards 12 pass and are connected to the connector jacks 16. The second connector jacks 17, on the other hand, are mounted on the other surface of the third printed board 15. The edge portion of the second printed board 13 is connected to the second connector jacks 17. Moreover, the third printed board 15 is connected to the electric power sources through connecting cables 21. The third printed board 15 is provided with printed conductor patterns (not illustrated) which provide electrical connections between the conductor pins 20, the connector jacks 18 and the cables 21, so that the electric power is fed to the components 11 to be tested and the driving circuit, and the high-frequency signals are fed from the driving circuit to the components 11 to be tested.

The printed board 15 of the connecting unit C forms a wall of the low-temperature section L, and the space 18 between the printed board 15 and the wall of the homoiothermic chamber 10 provides a ventilation passage, through which cool air is blown as illustrated by the arrows A, for heat insulation between the sections H and L.

In the above-described equipment according to the present invention, the length of the connection between the sections H and L is fairly small and, accordingly, the electrical characteristics of the equipment can be improved in contrast with conventional equipment.

Moreover, the conductor pins 20 disposed in the space or ventilation passage 18 have small cross sections and do not disturb the ventilation. Accordingly, the equipment of the present invention has good heat insulation characteristics.

Furthermore, the equipment according to the present invention is convenient. That is, the first and second printed boards 12 and 13 can be easily connected to and disconnected from the connecting unit C. In addition the connecting unit C can be attached to and detached from the homoiothermic chamber 10. Accordingly, when the equipment breaks down, the disassembly of the equipment, the discovery of malfunctioning portions, the repair of parts and the reassembly of the equipment can be easily performed.

I claim:

1. Testing equipment for electric components, comprising:
   a high-temperature section including a homoiothermic chamber in which a plurality of components to be tested are contained and heated to a constant high temperature;
   a low-temperature section including a driving circuit for generating signals to operate the components to be tested, and electric power sources for the driving circuit and the components to be tested; and
   connecting means for electrically connecting said high-temperature and low-temperature sections;
   said high-temperature section comprising a first printed board positioned in the homoiothermic chamber, on which the components to be tested are mounted,
   said low-temperature section comprising a second printed board on which said driving circuit is mounted, and
   said connecting means comprising a connecting unit including:
   a third printed board, having first and second surfaces, disposed outside the homoiothermic chamber, the first surface of the third printed board positioned facing a wall of the homoiothermic chamber so as to define a space therebetween;
   a first connector jack connected to the first surface of the third printed board by electrical conductor pins and secured to the wall of the homoiothermic chamber; and
   a second connector jack mounted on the second surface of the third printed board, said first and second printed boards being removably connected to the first and second connector jacks, respectively, and the electric power sources being connected to the third printed board.

2. Testing equipment according to claim 1, wherein the third printed board of the connecting unit forms a wall of said low-temperature section, and wherein the space between the third printed board and the wall of the homoiothermic chamber provides a ventilation passage for heat insulation between the high-temperature and low-temperature sections.

3. Apparatus for testing electrical components, comprising:
   a homoiothermic chamber, having walls, for heating a plurality of the electrical components to be tested to a constant high-temperature;
   a first printed board, positioned in the homoiothermic chamber, on which the electrical components to be tested are mounted;
   a driving circuit, operatively connected to the electrical components to be tested, for generating test signals to operate the electrical components to be tested;
   a second printed board upon which said driving circuit is mounted;
   a first connector jack secured to one of the walls of the homoiothermic chamber;
   electrical conductor pins extending from said first connector jack;
   a third pointed board having a first surface connected to said electrical conductor pins and positioned facing said one of the walls of the homoiothermic chamber to define a ventilation passage therebetween, said third printed board having a second surface; and
   a second connector jack secured to the second surface of said third printed board and connected to said second printed board, said third printed board electrically connecting said first and second printed boards, said first and second printed boards removably connected to the first and second connector jacks, respectively.

* * * * *

UNITED STATES PATENT AND TRADEMARK OFFICE
CERTIFICATE OF CORRECTION

PATENT NO. : 4,468,616
DATED : AUGUST 28, 1984
INVENTOR(S) : TSUTOMU YOSHIZAKI

It is certified that error appears in the above-identified patent and that said Letters Patent is hereby corrected as shown below:

FRONT PAGE, after "[22] Filed: Aug. 26, 1981" insert the following:

--[30] Foreign Application Priority Data
Aug. 29, 1980 [JP] ........... 55-119327--.

Col. 1, line 8, "ageing" should be --"ageing--;
line 9, "ment," should be -- ment", --.

Col. 2, line 43, "only" should be --only some--;
line 44, delete "only";
line 58, "15," should be --15--;
line 61, "is" should be --is,--.

Col. 3, line 31, "the equipment" should be --the maintenance of the equipment--;
line 34, "addition" should be --addition,--.

Signed and Sealed this

Twelfth Day of March 1985

[SEAL]

Attest:

DONALD J. QUIGG

Attesting Officer     Acting Commissioner of Patents and Trademarks